United States Patent
Liao et al.

(10) Patent No.: US 10,777,652 B2
(45) Date of Patent: Sep. 15, 2020

(54) SEMICONDUCTOR DEVICE AND MANUFACTURING METHOD THEREOF

(71) Applicant: Powerchip Semiconductor Manufacturing Corporation, Hsinchu (TW)

(72) Inventors: Hung-Kwei Liao, Taoyuan (TW); Chen-Chiang Liu, Hsinchu County (TW); Kuo-Sheng Shih, Hsinchu (TW); Yung-Yao Shih, Hsinchu (TW); Ming-Tsung Hsu, Chiayi County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/364,210

(22) Filed: Mar. 26, 2019

(65) Prior Publication Data
US 2020/0235220 A1  Jul. 23, 2020

(30) Foreign Application Priority Data
Jan. 19, 2019 (TW) .............................. 108102170 A

(51) Int. Cl.
*H01L 29/51* (2006.01)
*H01L 27/11524* (2017.01)
(Continued)

(52) U.S. Cl.
CPC ........ *H01L 29/515* (2013.01); *H01L 21/7682* (2013.01); *H01L 21/7684* (2013.01);
(Continued)

(58) Field of Classification Search
CPC ............. H01L 29/515; H01L 27/11524; H01L 29/518; H01L 21/7682; H01L 21/76819; H01L 21/7684
See application file for complete search history.

(56) References Cited

U.S. PATENT DOCUMENTS 7,741,191 B2 * 6/2010 Frohberg ............ H01L 21/7682
257/E21.319
9,269,718 B1 * 2/2016 Kuge ................ H01L 27/11524
(Continued)

FOREIGN PATENT DOCUMENTS

TW           201403748          1/2014

OTHER PUBLICATIONS

Wook H. Lee, "The Effect of Dimensional Scaling on the Erase Characteristics of NOR Flash Memory," IEEE Electron Device Letters, vol. 24, Apr. 2003, pp. 245-247.
(Continued)

*Primary Examiner* — William Coleman
(74) *Attorney, Agent, or Firm* — JCIPRNET

(57) ABSTRACT

A manufacturing method of a semiconductor device includes forming a plurality of flash memory structures on a semiconductor substrate, wherein each of the flash memory structures includes a floating gate formed on the semiconductor substrate and a control gate formed on the floating gate; forming at least one pseudo contact between the plurality of flash memory structures; forming a liner film conformally on a surface of the pseudo contact; forming an interlayer dielectric layer on the whole semiconductor substrate to cover the pseudo contact and form at least one air gap between the pseudo contact and the flash memory structure; planarizing the interlayer dielectric layer until the top of the pseudo contact is exposed; removing the pseudo contact to form a contact opening; and forming a conductive material in the contact opening.

15 Claims, 12 Drawing Sheets

(51) Int. Cl.
    *H01L 29/417*     (2006.01)
    *H01L 21/768*     (2006.01)
    *H01L 29/40*     (2006.01)

(52) U.S. Cl.
    CPC .. *H01L 21/76819* (2013.01); *H01L 21/76895* (2013.01); *H01L 27/11524* (2013.01); *H01L 29/401* (2013.01); *H01L 29/41725* (2013.01); *H01L 29/518* (2013.01)

(56) References Cited

U.S. PATENT DOCUMENTS

| | | | |
|---|---|---|---|
| 10,490,445 B2* | 11/2019 | Kamoshima | H01L 21/76837 |
| 2002/0036349 A1* | 3/2002 | Saito | H01L 23/5222 |
| | | | 257/758 |
| 2010/0295134 A1* | 11/2010 | Nagashima | H01L 27/11521 |
| | | | 257/390 |
| 2012/0126302 A1* | 5/2012 | Noda | H01L 21/764 |
| | | | 257/315 |

OTHER PUBLICATIONS

"Office Action of Taiwan Counterpart Application", dated Jun. 29, 2020, pp. 1-5.

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 108102170, filed on Jan. 19, 2019. The entirety of the above-mentioned patent application is hereby incorporated by reference herein and made a part of this specification.

BACKGROUND

Technical Field

The invention relates to a semiconductor device technique and more particularly, to a semiconductor device and a manufacturing method thereof.

Description of Related Art

A flash memory device is a type of non-volatile memory capable of multiple data writing, reading and erasing operations, and the stored data does not disappear even after the power is off, such that with these advantages, the flash memory device has become a non-volatile memory device broadly applied in personal computers and electronic equipment.

However, as the integrity of the flash memory device is continuously increased, a contact cross talk phenomenon may likely occur between a floating gate and a bit line (BL), and serious interference may occur during Fowler-Nordheim (FN) erase. As a result, a threshold voltage (Vth) wander may occur, and such interference may lead to an increased width of a threshold voltage distribution.

On the other hand, air gaps may be likely generated when an interlayer dielectric (ILD) layer is deposed between adjacent flash memory structures, such that a bit-line-to-bit-line short circuit may occur when a conductive material is subsequently deposed, which affects performance of a subsequently formed semiconductor device.

SUMMARY

The present invention provides a semiconductor device and a manufacturing method thereof, capable of preventing a bit-line-to-bit-line short circuit while a contact cross talk phenomenon occurs, so as to improve performance of the semiconductor device.

A manufacturing method of a semiconductor device of the invention includes the following steps. A plurality of flash memory structures are formed on a semiconductor substrate, wherein each of the flash memory structures includes a floating gate formed on the semiconductor substrate and a control gate formed on the floating gate. Thereafter, at least one pseudo contact is formed between the plurality of flash memory structures, and a liner film is formed conformally on a surface of the pseudo contact. Then, an interlayer dielectric layer is formed on the whole semiconductor substrate to cover the pseudo contact and form at least one air gap between the pseudo contact and the flash memory structure. The interlayer dielectric layer is planarized until a top of the pseudo contact is exposed, and the pseudo contact is removed to form a contact opening. Afterwards, a conductive material is formed in the contact opening.

In an embodiment of the invention, the top of the pseudo contact is higher than a top of the flash memory structure.

In an embodiment of the invention, a material of the pseudo contact is different from the conductive material.

In an embodiment of the invention, a material of the pseudo contact includes polysilicon, and the conductive material includes tungsten (W).

In an embodiment of the invention, the liner film includes a tetraethoxysilane (TEOS) oxide layer, a SixNy layer or a combination thereof.

In an embodiment of the invention, the step of planarizing the interlayer dielectric layer includes removing the liner film on the top of the pseudo contact.

In an embodiment of the invention, before forming the pseudo contact, the method further includes forming a silicon nitride layer conformally on the semiconductor substrate to cover the flash memory structures.

In an embodiment of the invention, after removing the pseudo contact, the method further includes removing the silicon nitride layer in the contact opening.

In an embodiment of the invention, after forming the conductive material, the method further includes planarizing the conductive material, until the interlayer dielectric layer is exposed to form at least one contact and then, forming a metal wire on the interlayer dielectric layer to connect the contact.

A semiconductor device of the invention includes a semiconductor substrate, a plurality of flash memory structures, at least one contact, an interlayer dielectric layer, an air gap and a liner film. The plurality of flash memory structures are formed on the semiconductor substrate, wherein each of the flash memory structures includes a floating gate formed on the semiconductor substrate and a control gate formed on the floating gate. The contact is formed between the plurality of flash memory structures and contacts the semiconductor substrate. The interlayer dielectric layer is formed on the semiconductor substrate except for the contact and covers the flash memory structures. The air gap is formed in the interlayer dielectric layer between the contact and the flash memory structures. The liner film is disposed between the contact and the interlayer dielectric layer and between the contact and the air gap.

In another embodiment of the invention, the semiconductor device further includes a silicon nitride layer disposed below the interlayer dielectric layer to cover the flash memory structures.

In another embodiment of the invention, the liner film extends to be between the silicon nitride layer and the interlayer dielectric layer.

In another embodiment of the invention, the liner film includes a TEOS oxide layer, a SixNy layer or a combination thereof.

In another embodiment of the invention, the contact is a bit-line contact.

In another embodiment of the invention, the semiconductor device is an NOR flash memory or an NAND flash memory.

Based on the above, in the invention, by first forming the pseudo contact between the plurality of flash memory structures of the semiconductor device and disposing the liner film on the surface of the pseudo contact, so as to prevent the occurrence of a bit-line-to-bit-line short circuit due to the conductive material being filled in the air gap during a subsequent process of forming the conductive material. Even though a larger air gap is formed between adjacent flash memory structures, the occurrence of interconnection of the conductive material can be effectively prevented. In this way, since an air gap disposed between a real contact and the flash memory structure is a low-k material with respect to the interlayer dielectric layer, the occurrence of the parasitic capacitance and the cross talk can be prevented. Thus, the invention can achieve improving performance and a yield rate of the semiconductor device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
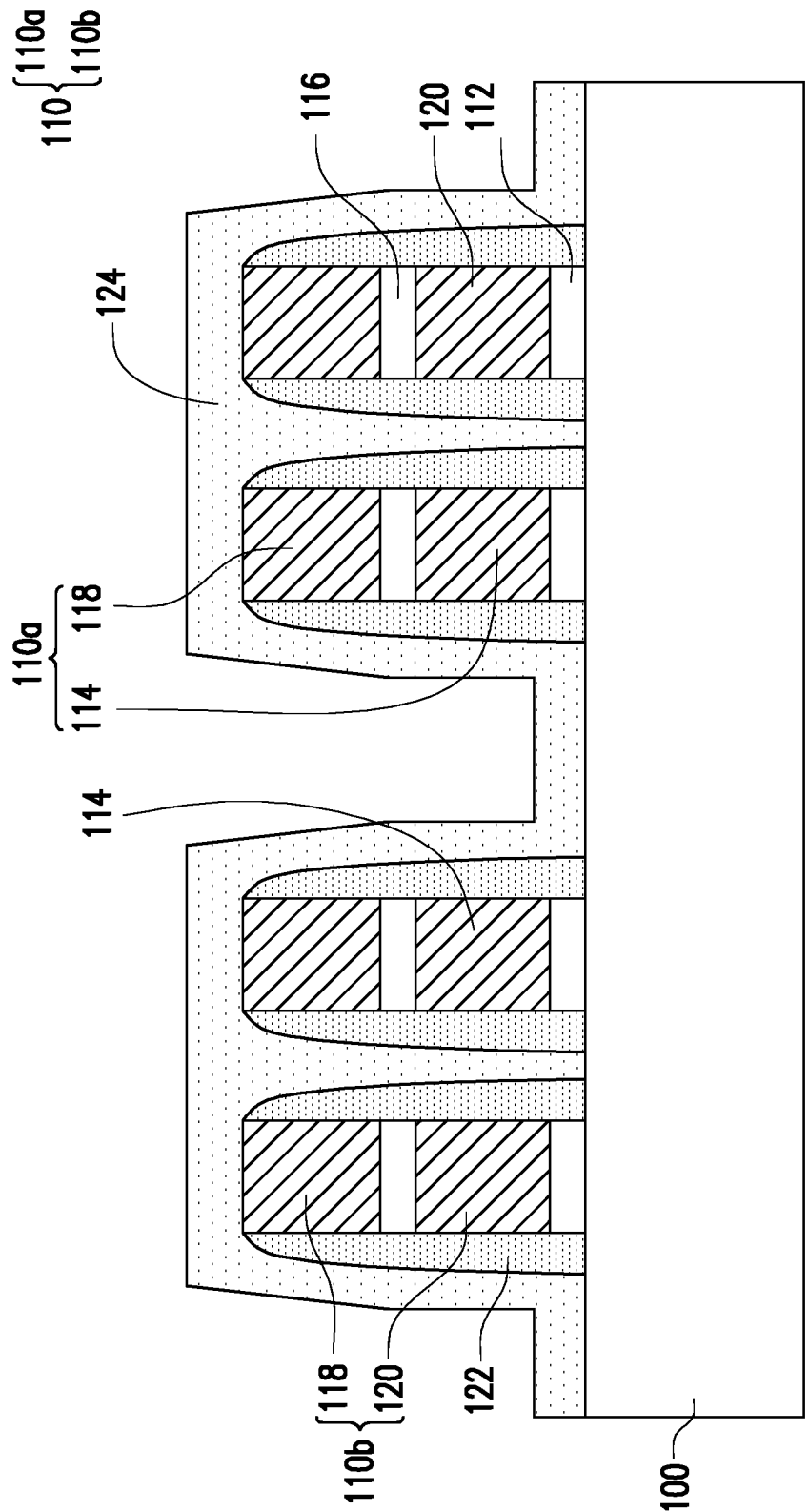
FIG. 1, FIG. 2A, FIG. 3, FIG. 4, FIG. 5A, FIG. 6 to FIG. 10 are schematic cross-sectional views of a manufacturing process of a semiconductor device according to an embodiment of the invention.

Several embodiments are described in detail below with reference to the accompanying drawings. However, the embodiments provided herein are not intended to limit the scope of the disclosure. In addition, the drawings are for illustrative purposes only and are not illustrated according to actual dimensions. To facilitate understanding, the same elements will hereinafter be denoted by the same reference numerals. In addition, terms such as "contain," "include," "have" and the like used herein are all open terms, which mean including but not limited to. Moreover, directional terms mentioned herein, such as "on" and "below," are only directions relative to the drawings. Therefore, the directional terms are used to illustrate rather than limit the disclosure.

FIG. 1 to FIG. 10 are schematic cross-sectional views of a manufacturing process of a semiconductor device according to an embodiment of the invention. The manufacturing process in the present embodiment takes the manufacturing of an NOR flash memory for example. However, the invention is not limited thereto, and in other embodiments, the manufacturing process may be used for the manufacturing of an NAND flash memory or other semiconductor devices having the same issue.

First, referring to FIG. 1, a plurality of flash memory structures 110 are formed on a semiconductor substrate 100. In the present embodiment, the semiconductor substrate 100 may be a silicon substrate or other suitable semiconductor substrates. In FIG. 1, only four flash memory structures 110 are illustrated. In other embodiments, the number of the flash memory structures may be adjusted based on a design demand, but the invention is not limited thereto.

In the present embodiment, the flash memory structures 110 include, for example, flash memory structures 110a or flash memory structures 110b. Each of the flash memory structures 110a includes a floating gate 114 formed on the semiconductor substrate 100 and a control gate 118 formed on the floating gate 114. There is, for example, a dielectric layer 112 between the semiconductor substrate 100 and each floating gate 114, and there is, for example, an inter-gate dielectric layer 116 between each floating gate 114 and each control gate 118. For example, a material of the floating gate 114 and the control gate 118 is doped polysilicon, a material of the dielectric layer 112 is silicon oxide, and a material of the inter-gate dielectric layer 116 is, for example, silicon oxide/silicon nitride or silicon oxide/silicon nitride/silicon oxide. In an embodiment, a spacer 122 may also be present on side walls of the floating gate 114 and the control gate 118. A material of the spacer 122 is, for example, silicon nitride.

In FIG. 1, another flash memory structure 110b is present at a side of each of the flash memory structures 110a. In the NOR flash memory, a floating gate of each of the flash memory structures 110b is used as an assisted gate 120. A material of the assisted gate 120 is, for example, doped polysilicon. In the present embodiment, the spacer 122 may also be present on side walls of the assisted gate 120 and the control gate 118.

In the present embodiment, each adjacent flash memory structures 110 have structures that are the same as and symmetrical to each other (i.e., in a mirror-like disposition). For example, two flash memory structures 110b are formed at two opposite sides of the adjacent flash memory structures 110a, but the invention is not limited thereto.

Then, a silicon nitride layer 124 is formed, for example, conformally on the semiconductor substrate 100 to cover the plurality of flash memory structures 110. A method of forming the silicon nitride layer 124 includes, for example, a thermal oxidation method, a chemical vapor deposition (CVD) method or an atomic layer deposition method, but the invention is not limited thereto.

Figure 2A:
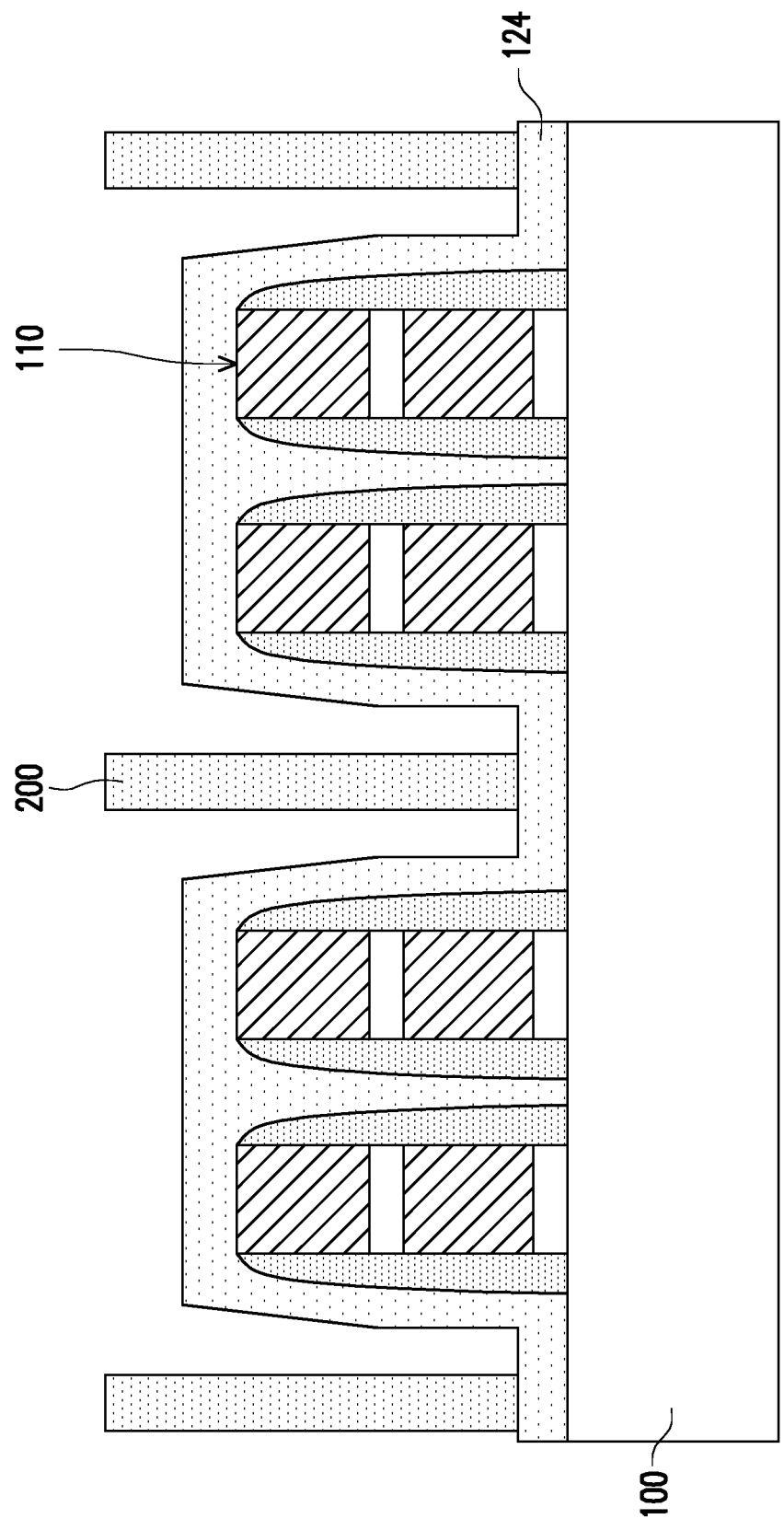
Figure 2B:
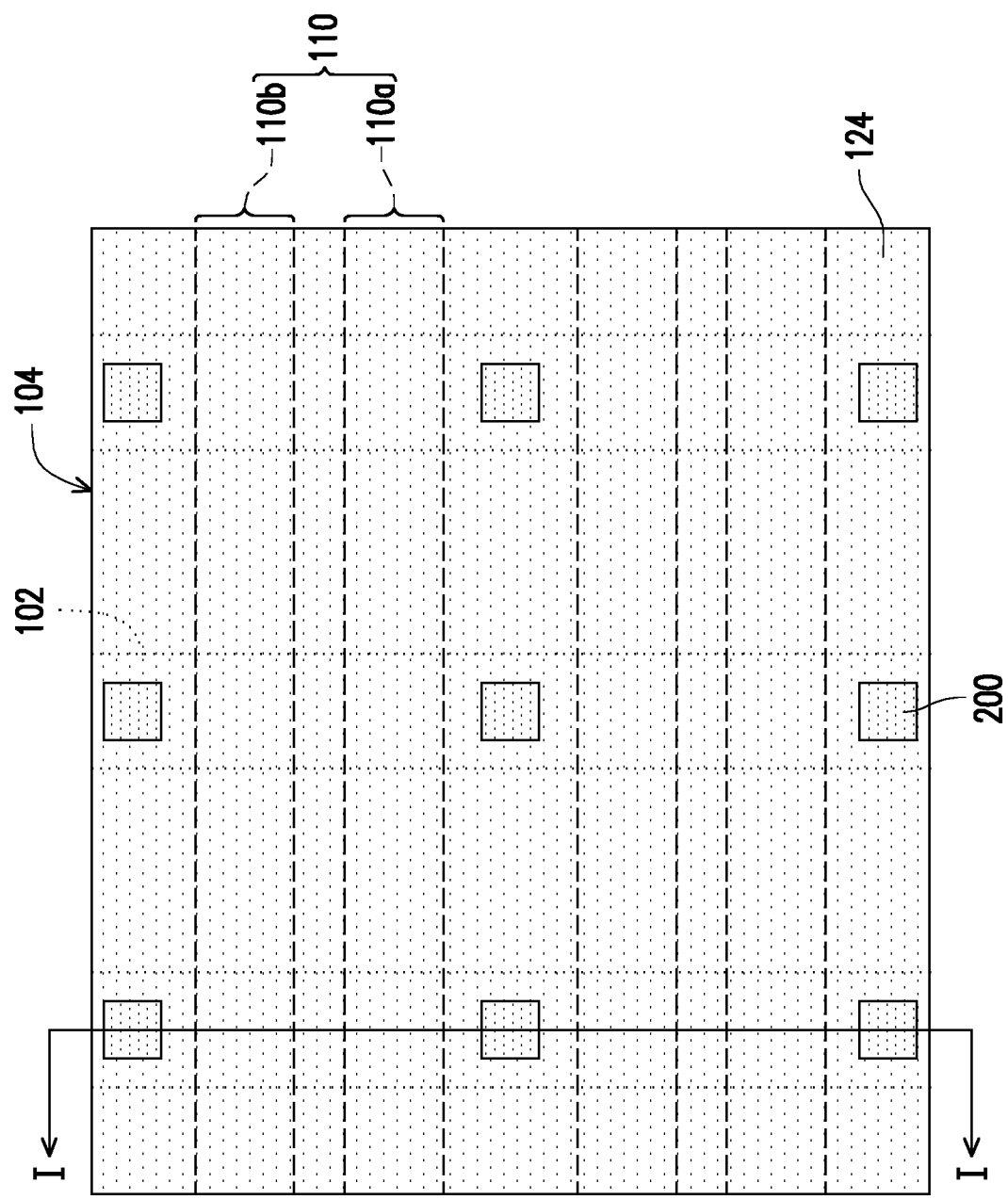
FIG. 2B is a schematic top view of FIG. 2A.

FIG. 2A and FIG. 2B are schematic views of a step following the step illustrated in FIG. 1. To facilitate understanding, positions of active areas 102 of the semiconductor substrate 100 and the flash memory structures 110 are shown by dotted lines in FIG. 2B. FIG. 2A is a schematic cross-sectional view of FIG. 2B along a line I-I.

Referring to FIG. 2A and FIG. 2B, pseudo contacts 200 are formed between the flash memory structures 110, and it may be observed according to the top view (FIG. 2B) that a device isolation structure 104 is disposed in the semiconductor substrate 100 to define the active areas 102. The device isolation structure 104 is, for example, a shallow trench isolation structure and is usually formed in the semiconductor substrate 100 before the flash memory structures 110 are formed. The pseudo contacts 200 are, for example, formed on the active area 102 of the semiconductor substrate 100, which serve as predetermined positions where bit-line contacts are subsequently to be formed. A method of forming the pseudo contacts 200 includes, for example, forming a polysilicon layer (not shown) on the semiconductor substrate 100 by a CVD method to cover the silicon nitride layer 124. Then, a patterned mask layer (not shown) is formed on the polysilicon layer, and the patterned mask layer, for example, presents a predetermined pattern of the pseudo contacts which are subsequently to be formed. Thereafter, after the polysilicon layer which is not covered by the patterned mask layer is removed by an etching process, the patterned mask layer is then removed so as to form the pseudo contacts 200. In FIG. 2B, though the pattern of the pseudo contacts 200 according to the top view is illustrated in a square shape, the invention is not limited thereto, and the pattern shape of the pseudo contact 200 may be adjusted based on a design demand.

Figure 3:
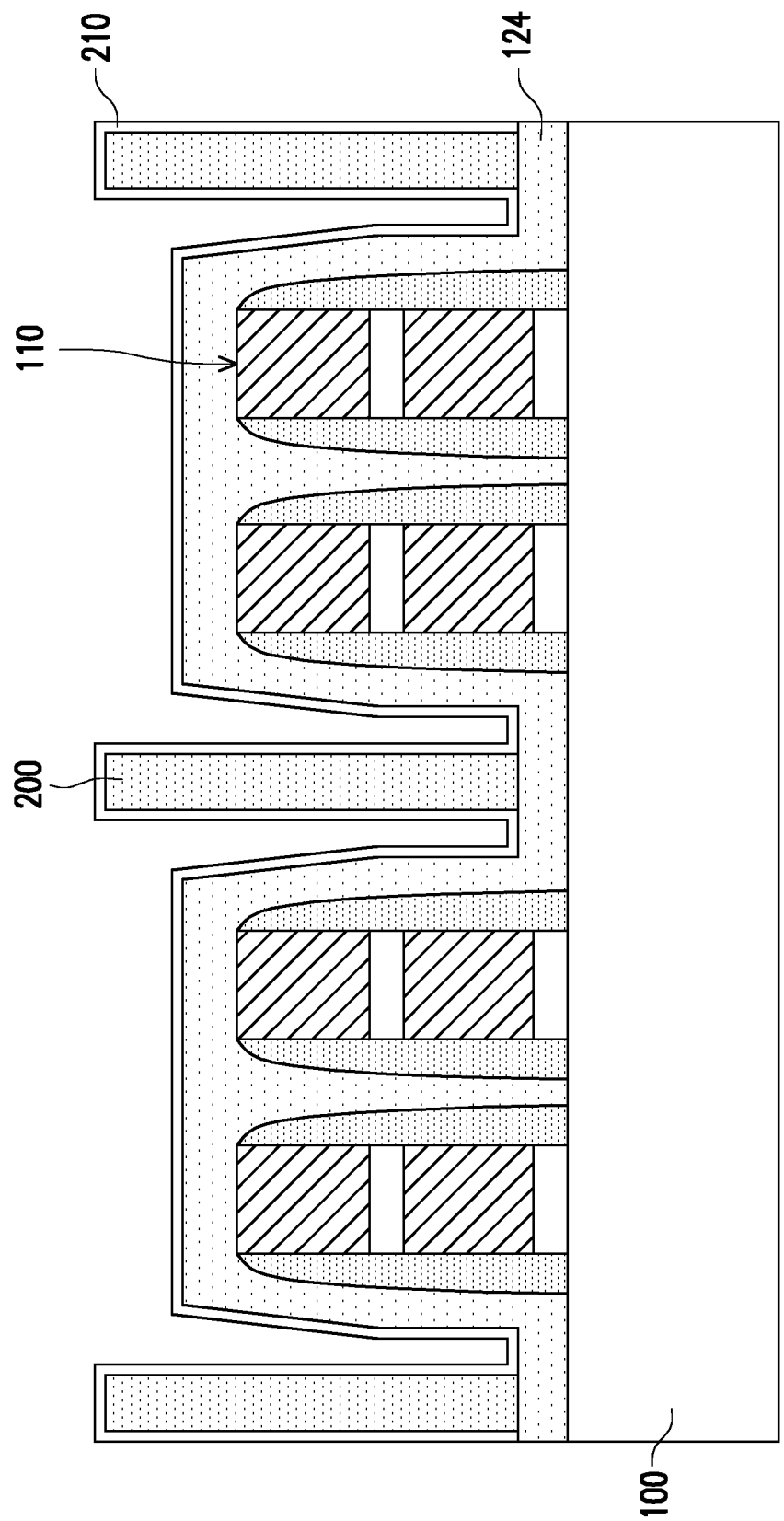

FIG. 3 is a schematic view of a step following the step illustrated in FIG. 2A and FIG. 2B.

Referring to FIG. 3, a liner film 210 is formed conformally on a surface of each of the pseudo contacts 200 and may extend to be on the silicon nitride layer 124. For example, the liner film 210 includes a tetraethoxysilane (TEOS) oxide layer, a SixNy layer or a combination thereof, but the invention is not limited thereto. A method of forming the liner film 210 is, for example, a CVD method. In the present embodiment, a thickness of the liner film 210 is, for example, 10 nm to 20 nm, but the invention is not limited thereto. The thickness of the liner film 210 may be adaptively adjusted based on a design demand of the process.

Figure 4:
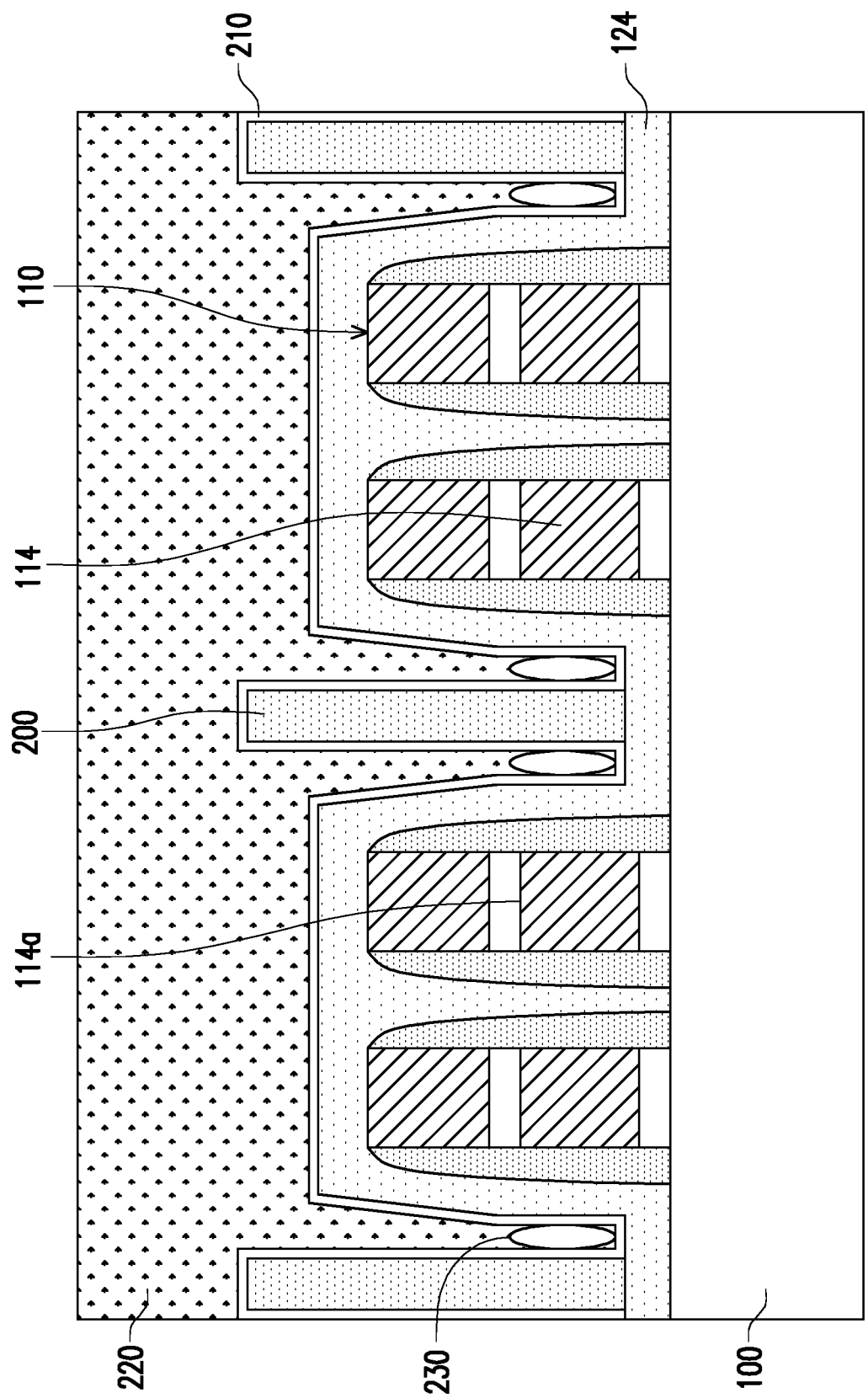

FIG. 4 is a schematic view of a step following the step illustrated in FIG. 3.

Referring to FIG. 4, an interlayer dielectric layer 220 is formed on the whole semiconductor substrate 100 to cover the pseudo contacts 200, and air gaps 230 are formed between each of the pseudo contacts 200 and each of the flash memory structures 110. A top of each of the formed air gap 230 is preferably not higher than a top 114a of the floating gate 114. In this way, because the air gap between a subsequently formed real contact and the flash memory structures is a low-k material with respect to the interlayer dielectric layer 220 (e.g., $SiO_2$), the occurrence of a parasitic capacitance and a cross talk phenomenon may be reduced. In the present embodiment, a material of the interlayer dielectric layer 220 may be, for example, a material having a different etching selectivity from that of the pseudo contacts 200.

Figure 5A:
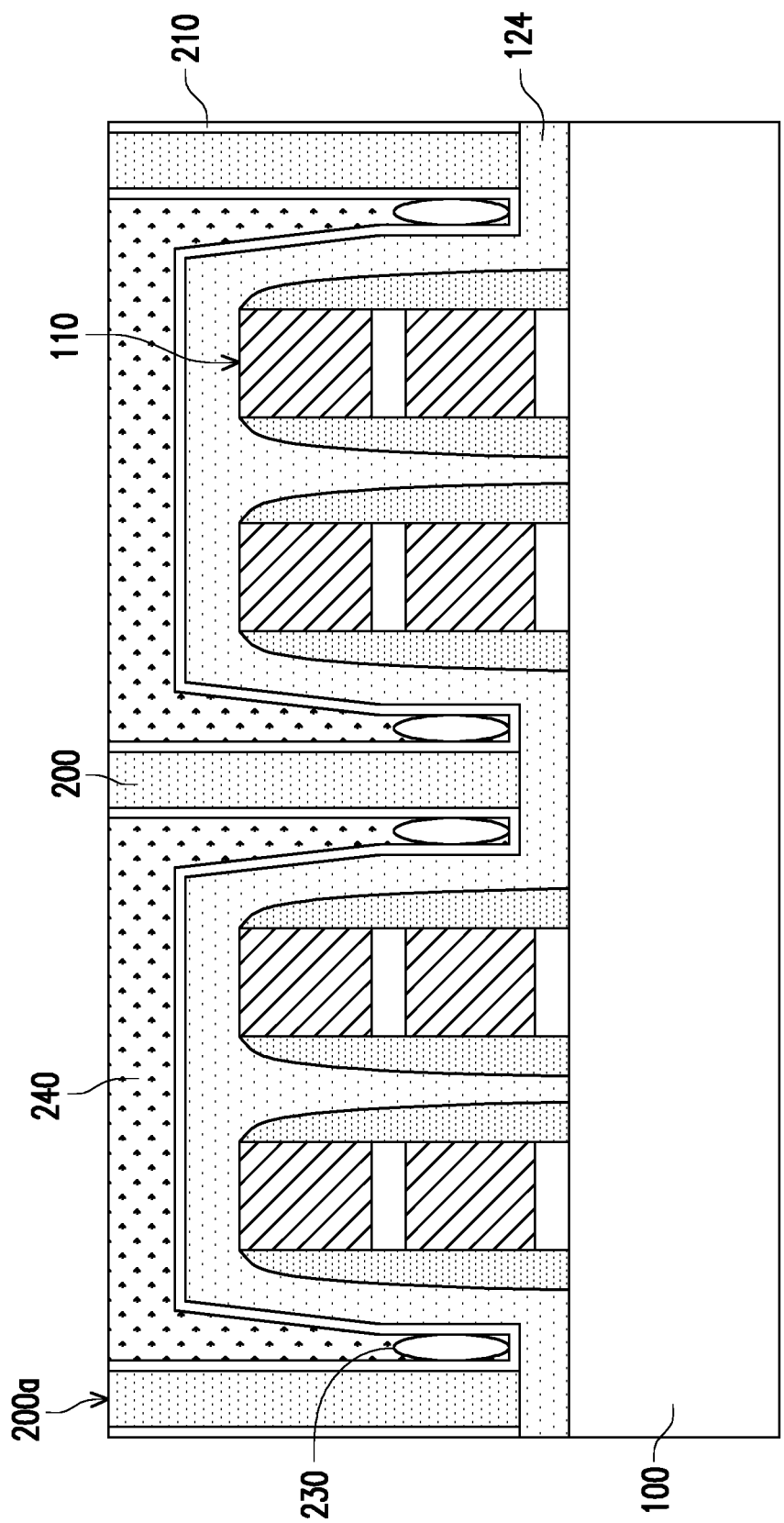
Figure 5B:
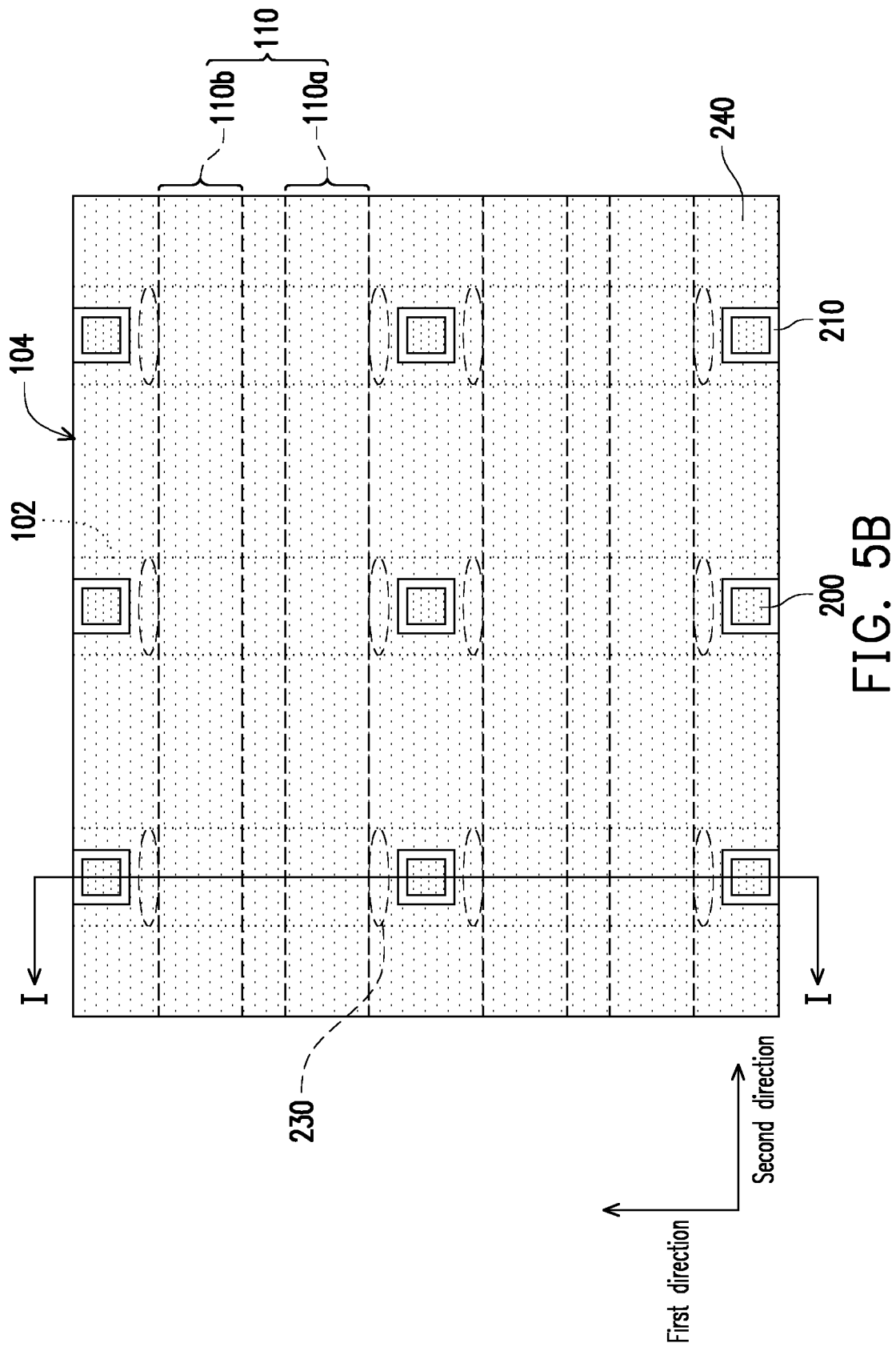
FIG. 5B is a schematic top view of FIG. 5A.

FIG. 5A and FIG. 5B are schematic views of a step following the step illustrated in FIG. 4. To facilitate understanding, positions of the active areas 102 of the semiconductor substrate 100 being parallel to a first direction, the flash memory structures 110 being parallel to a second direction which is orthogonal to the first direction and the air gaps 230 are shown by dotted lines in FIG. 5B.

Referring to FIG. 5A and FIG. 5B, the interlayer dielectric layer 220 is planarized until a top 200a of each of the pseudo contacts 200 is exposed to form an interlayer dielectric layer 240, and the step of planarizing may include removing the liner film 210 on the top 200a of each of the pseudo contacts 200. In the present embodiment, a method of planarizing the interlayer dielectric layer 220 includes, for example, a chemical mechanical polishing method.

For example, if an undesirable air gap appears between adjacent pseudo contacts 200 due to the interlayer dielectric layer 220 being covered, and the air gap is then exposed after planarizing interlayer dielectric layer 220, it may cause the adjacent contacts to be connected by a subsequently-filled conductive material, resulting in a bit-line-to-bit-line short circuit. However, the liner film 210 is present around each of the pseudo contacts 200, and thus, even though the conductive material is filled in the undesirable air gaps, the condition that the adjacent contacts are connected by the conductive material may be effectively prevented in the presence of the liner film 210. Namely, the bit-line-to-bit-line short circuit may be prevented, thereby improving the performance and the yield of the semiconductor device.

Figure 6:
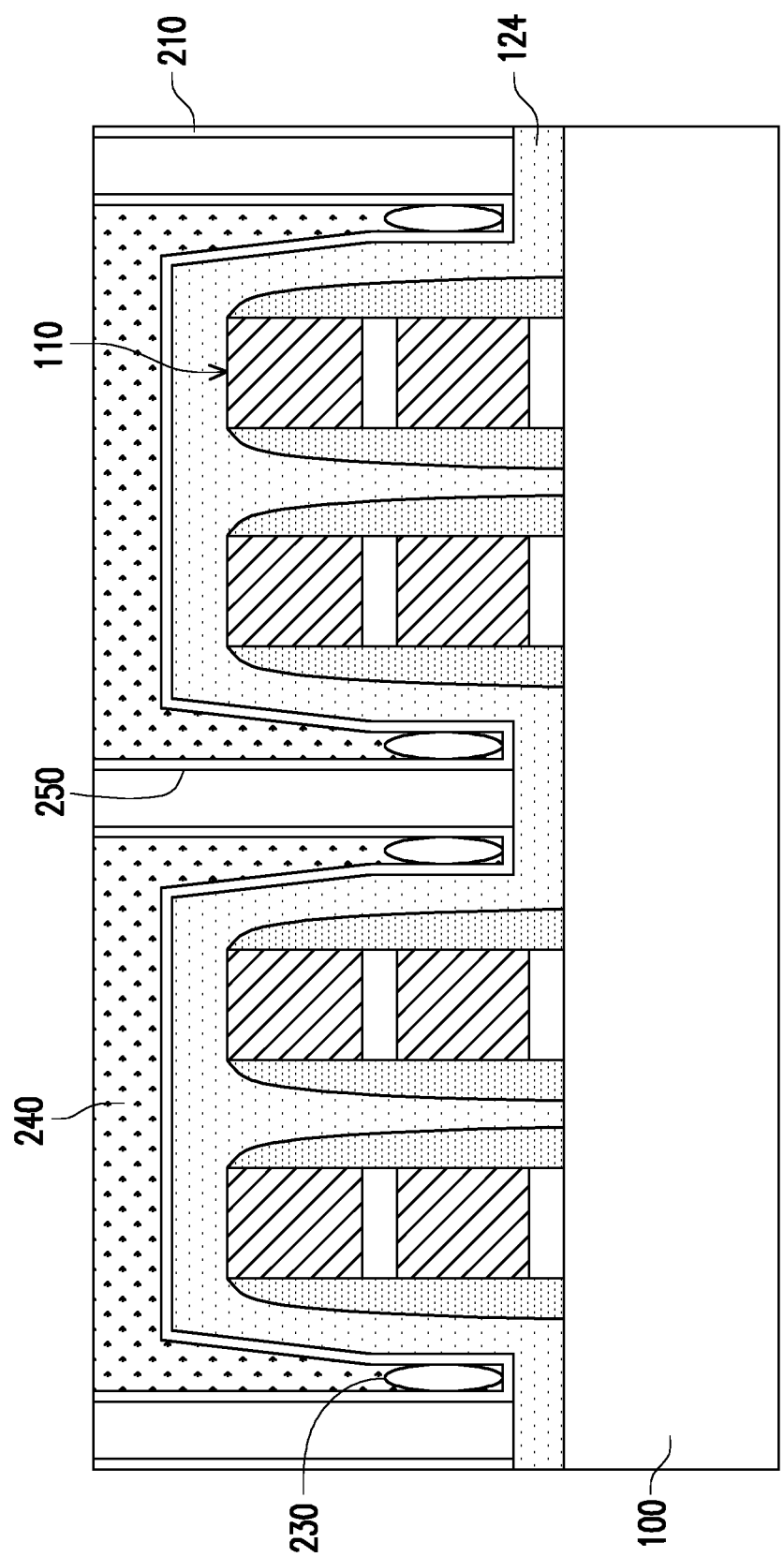

FIG. 6 is schematic view of a step following the step illustrated in FIG. 5A and FIG. 5B.

Referring to FIG. 6, the pseudo contacts 200 are removed to form contact openings 250. In the present embodiment, since the pseudo contact 200 and the interlayer dielectric layer 240 have a high etching selectivity, the pseudo contacts 200 are removed by using the interlayer dielectric layer 240 as a hard mask layer, and a part of the silicon nitride layer 124 is exposed. A method of removing the pseudo contacts 200 may include an anisotropic etching method, for example, a dry etching method.

Figure 7:
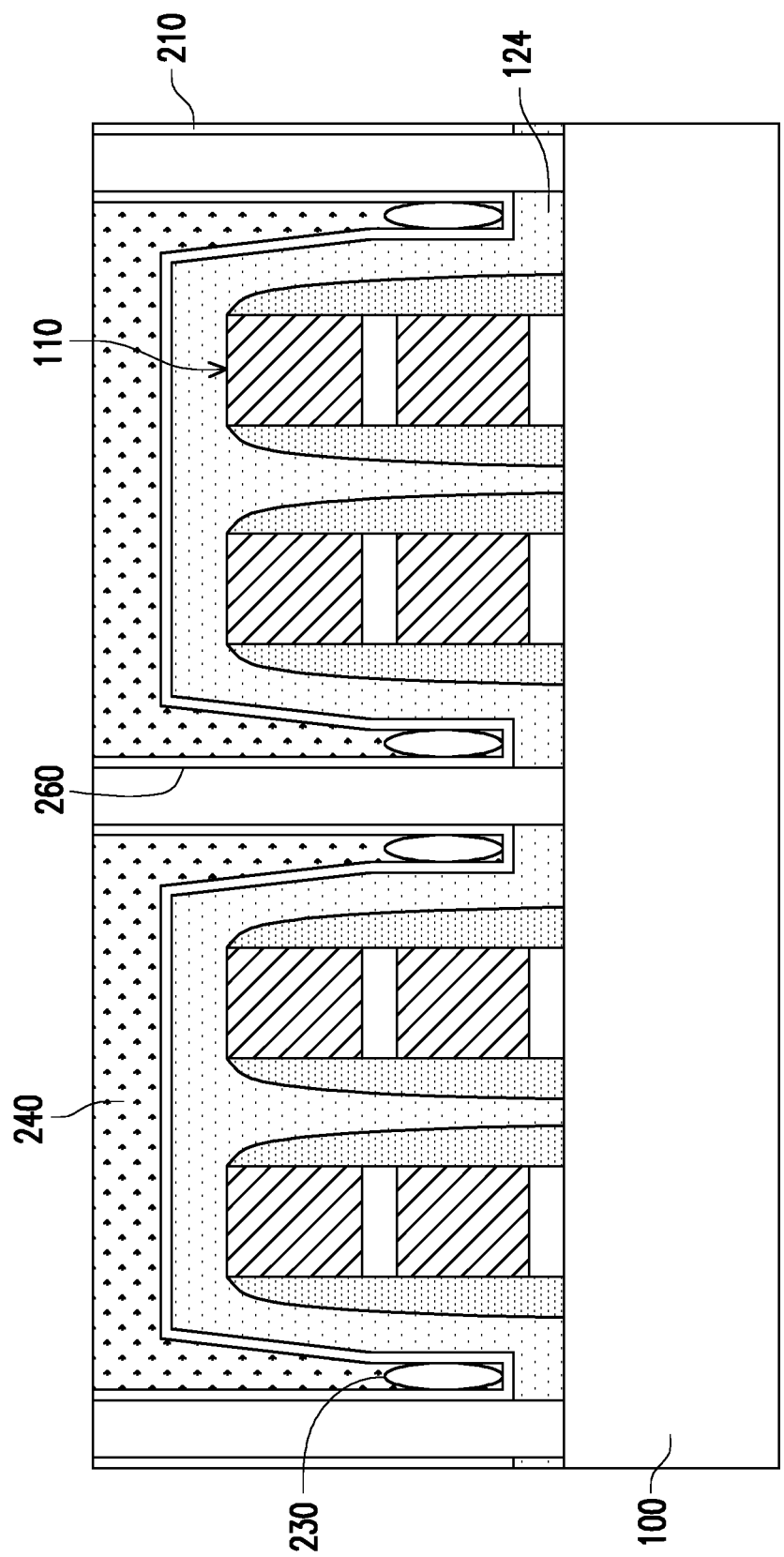

FIG. 7 is schematic view of a step following the step illustrated in FIG. 6.

Referring to FIG. 7, after the pseudo contacts 200 are removed, if the silicon nitride layer 124 is already present, the silicon nitride layer 124 in the contact openings 250 may be selectively removed to expose a part of the semiconductor substrate 100 and form a plurality of contact openings 260. A method of removing the silicon nitride layer 124 may include an anisotropic etching method, for example, a dry etching method.

Figure 8:
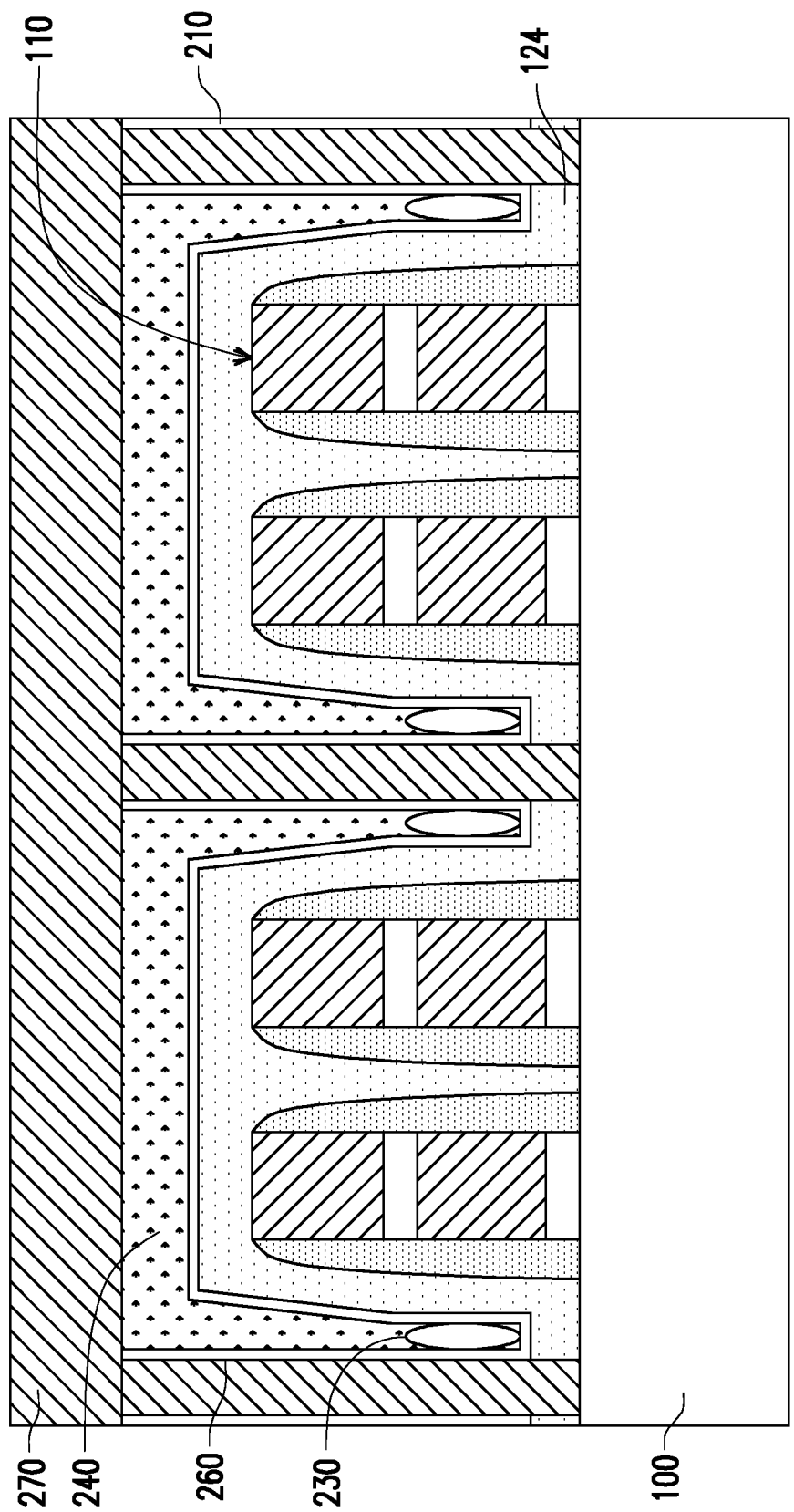

FIG. 8 is schematic view of a step following the step illustrated in FIG. 7.

Referring to FIG. 8, a conductive material 270 is formed in the contact openings 260. In the present embodiment, the conductive material 270 may be the same as or different from the material of the pseudo contacts 200. For example, the conductive material 270 includes, for example, tungsten (W) or any other suitable conductive material, but the invention is not limited thereto. A method of forming the conductive material 270 is, for example, a CVD method, a physical vapor deposition (PVD) method or a combination thereof.

Figure 9:
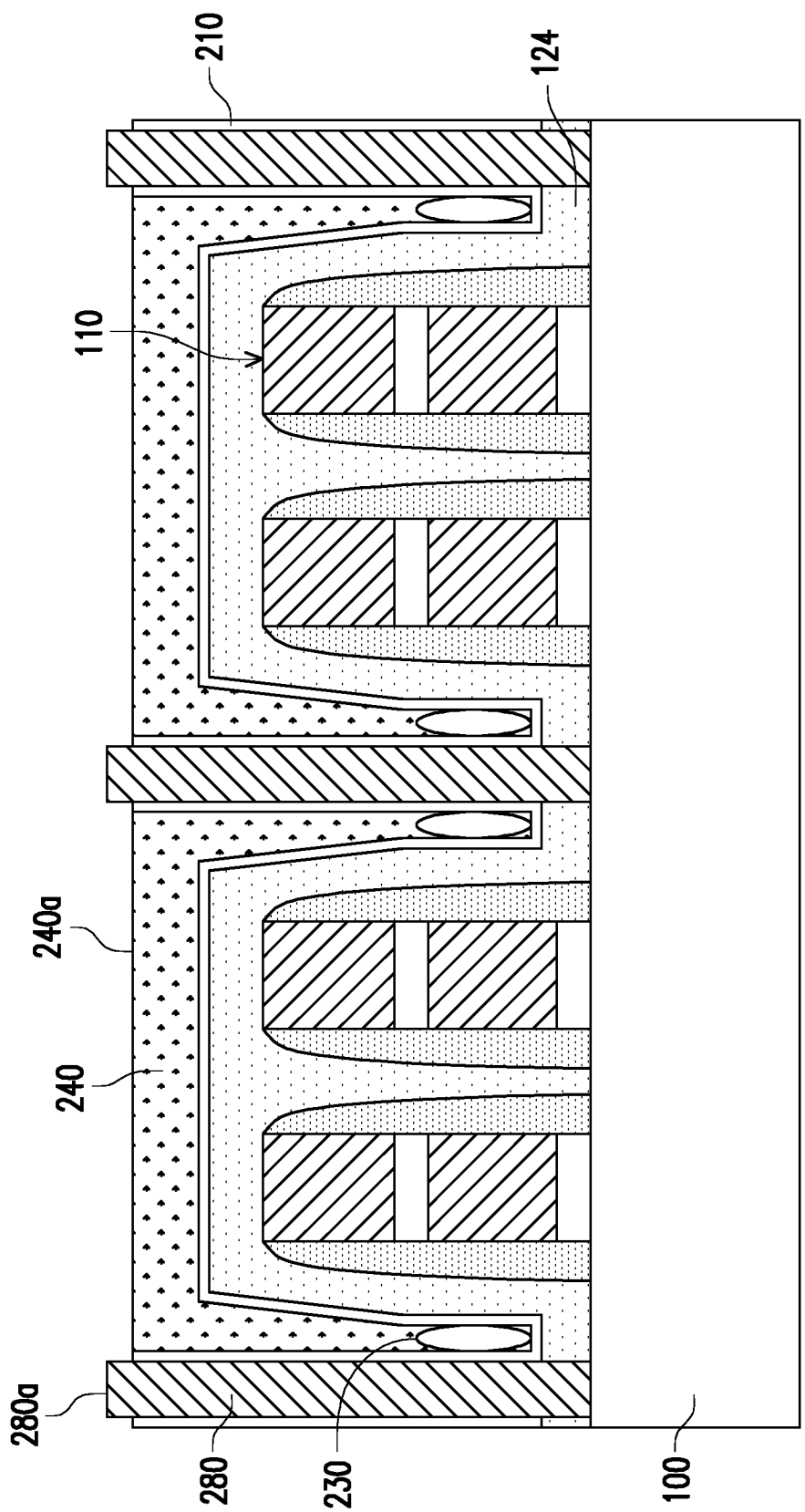

FIG. 9 is schematic view of a step following the step illustrated in FIG. 8.

Referring to FIG. 9, the conductive material 270 is planarized until the interlayer dielectric layer 240 is exposed to form a contacts 280. In the present embodiment, after the conductive material 270 is planarized, the slurry type may be changed, such that a top 280a of each of the formed contacts 280 is higher than a top 240a of the interlayer dielectric layer 240, thereby ensuring that a subsequently formed bit line may be connected to the contacts 280. In other embodiments, the top 280a of the contacts 280 may also be co-planar with the top 240a of the interlayer dielectric layer 240, or may be lower than the top 240a of the interlayer dielectric layer 240, thereby ensuring that no conductive material remains on the surface of the interlayer dielectric layer 240, but the invention is not limited thereto. In other words, it is sufficient as long as the top 280a of the contacts 280 may be exposed after the conductive material 270 is planarized. During the process of forming the conductive material, even though there is any undesirable air gap formed between any adjacent contacts 280 in the interlayer dielectric layer 240, the air gap is not exposed, and the condition that the adjacent contacts are connected by the conductive material may be effectively prevented. Namely, the bit-line-to-bit-line short circuit may be prevented, thereby improving the performance and the yield of the semiconductor device.

Figure 10:
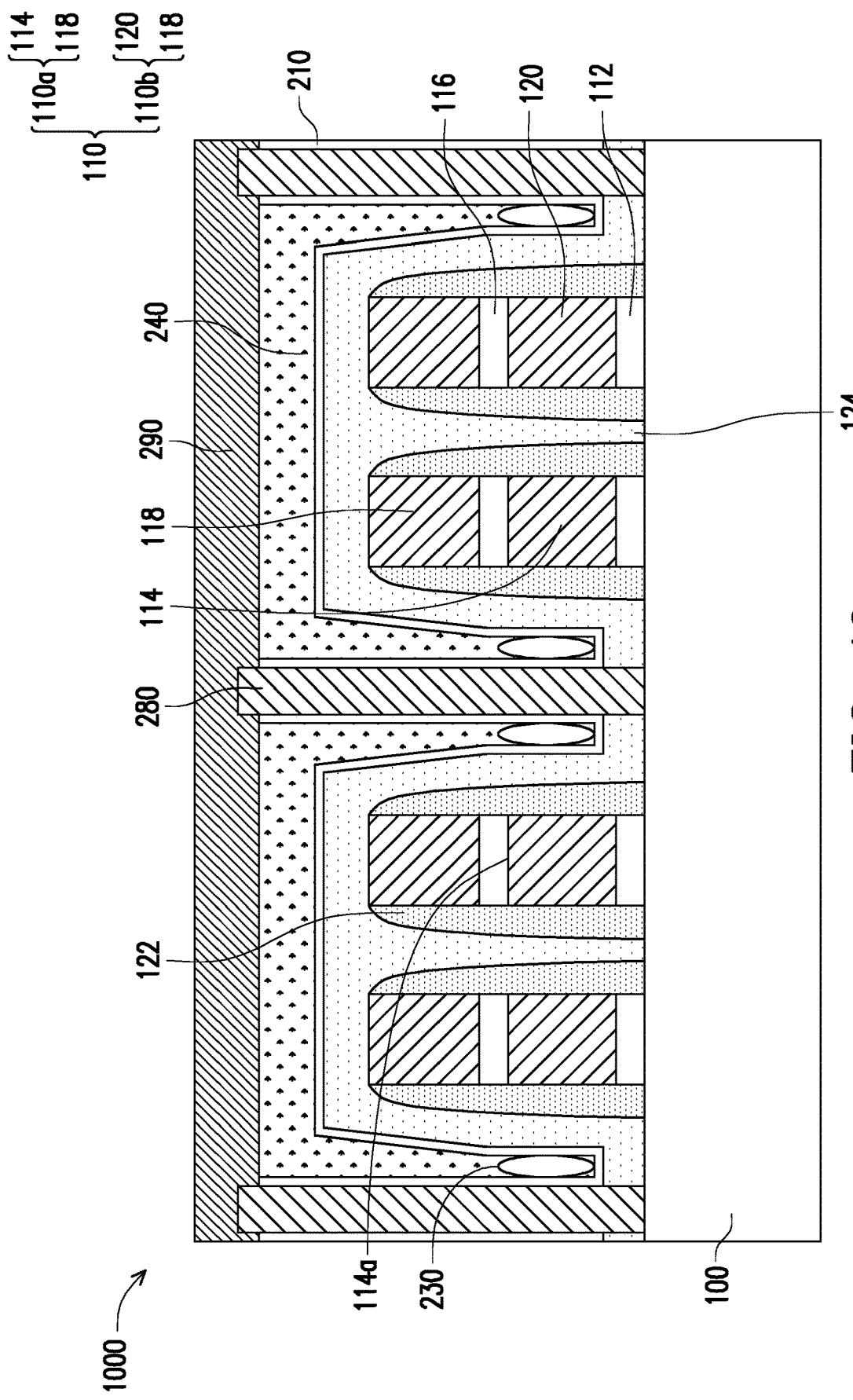

FIG. 10 is schematic view of a step following the step illustrated in FIG. 9.

Referring to FIG. 10, a metal wire 290 used as a bit line is formed on the interlayer dielectric layer 240 to connect the contacts 280. So far, the manufacturing of the semiconductor device 1000 (i.e., the NOR flash memory) is substantially completed.

Next, a structure of a semiconductor device 1000 of the embodiments of the invention will be described with reference to FIG. 10.

Referring to FIG. 10, the semiconductor device 1000 of another embodiment of the invention includes the semiconductor substrate 100, the plurality of flash memory structures 110, the contacts 280, the interlayer dielectric layer 240, the air gaps 230 and the liner film 210. In the present embodiment, the semiconductor device 1000 is implemented as an NOR flash memory for example. However, the invention is not limited thereto, and in other embodiments, the semiconductor device 1000 may also be an NAND flash memory or other semiconductor devices having the same issue.

In the present embodiment, the plurality of flash memory structures 110 are formed on the semiconductor substrate 100, and the flash memory structures 110 include, for example, flash memory structures 110a and flash memory structures 110b. Each of the flash memory structures 110a includes the floating gate 114 formed on the semiconductor substrate and the control gate 118 formed on the floating gate 1148. For example, the dielectric layer 112 is disposed between the semiconductor substrate 100 and the floating gate 114, and the inter-gate dielectric layer 116 is disposed between the floating gate 114 and the control gate 118. The spacers 122 may also be disposed on the side walls of the floating gate 114 and the control gate 118. In an embodiment, each of the flash memory structures 110b is, for example, formed at a side of each of the flash memory structures 110a. In the NOR flash memory, the floating gate of each of the flash memory structures 110b is used as the assisted gate 120. In the present embodiment, the spacers 122 may also be disposed on the side walls of the assisted gate 120 and the control gate 118.

In the present embodiment, the contacts 280 are formed between the plurality of flash memory structures 110a (or 110b) and contacts the semiconductor substrate 100. The contacts 280 are, for example, bit-line contacts. The interlayer dielectric layer 240 is formed on the semiconductor substrate 100 except for the contacts 280 and covers the flash memory structures 110. In the present embodiment, the semiconductor device 1000, for example, further includes a silicon nitride layer 124 disposed below the interlayer dielectric layer 240 and covering the plurality of flash memory structures 110.

In the present embodiment, the air gaps 230 are formed in the interlayer dielectric layer 240 between each of the contacts 280 and each of the flash memory structures 110. For example, the top of each of the air gaps 230 is preferably not higher than the top 114a of the floating gate 114. In this way, since the air gaps 230 exist between each of the contacts 280 and its adjacent flash memory structures 110a/110b, the air which is a low-k material with respect to the interlayer dielectric layer 240 (e.g., $SiO_2$) is capable of reducing the occurrence of the parasitic capacitance and the cross talk phenomenon.

In the present embodiment, the liner film 210 is disposed between each of the contacts 280 and the interlayer dielectric layer 240 and between each of the contacts 280 and each of the air gaps 230. For example, the liner film 210 may extend to be between the silicon nitride layer 124 and the interlayer dielectric layer 240, and the liner film 210 is, for example, a TEOS oxide layer, a SixNy layer or a combination thereof.

In an embodiment, if any undesirable air gap exists between any adjacent contacts 280 in the interlayer dielectric layer 240 (for example, the tops of the air gaps are higher than the tops 114a of the floating gates 114), a condition that the conductive material is filled in the air gaps to connect the adjacent contacts may likely occur, which may cause the bit-line-to-bit-line short circuit. However, as the liner film 210 is present around each of the contacts 280, even though the conductive material is filled in the air gaps, the condition that the adjacent contacts are connected by the conductive material may be effectively prevented in the presence of the liner film 210. Namely, the bit-line-to-bit-line short circuit may be prevented, thereby improving the performance and the yield of the semiconductor device.

In view of the foregoing, according to the invention, by first forming the pseudo contact between the plurality of flash memory structures in the semiconductor device and disposing the liner film on the surface of the pseudo contact, so as to prevent the occurrence of the bit-line-to-bit-line short circuit due to the conductive material being filled in the air gap during the subsequent process of forming the conductive material. Even though a larger air gap is formed between adjacent flash memory structures, the occurrence of interconnection of the conductive material can be effectively prevented. Since the air gap disposed between a real contact and the flash memory structure is a low-k material with respect to the interlayer dielectric layer, the occurrence of the parasitic capacitance and the cross talk can be reduced. Thus, the invention can achieve improving the performance and the yield of the semiconductor device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:

forming a plurality of flash memory structures on a semiconductor substrate, wherein each of the flash memory structures comprises a floating gate formed on the semiconductor substrate and a control gate formed on the floating gate;

forming at least one pseudo contact between the plurality of flash memory structures;

forming a liner film conformally on a surface of the pseudo contact;

forming an interlayer dielectric layer on the whole semiconductor substrate to cover the pseudo contact and form at least one air gap between the pseudo contact and each of the flash memory structures;

planarizing the interlayer dielectric layer until a top of the pseudo contact is exposed;

removing the pseudo contact to form a contact opening; and forming a conductive material in the contact opening.

2. The manufacturing method of the semiconductor device according to claim 1, wherein the top of the pseudo contact is higher than a top of the flash memory structure.

3. The manufacturing method of the semiconductor device according to claim 1, wherein a material of the pseudo contact is different from the conductive material.

4. The manufacturing method of the semiconductor device according to claim 1, wherein a material of the pseudo contact comprises polysilicon, and the conductive material comprises tungsten (W).

5. The manufacturing method of the semiconductor device according to claim 1, wherein the liner film comprises a tetraethoxysilane (TEOS) oxide layer, a SixNy layer or a combination thereof.

6. The manufacturing method of the semiconductor device according to claim 1, wherein the step of planarizing the interlayer dielectric layer comprises: removing the liner film on the top of the pseudo contact.

7. The manufacturing method of the semiconductor device according to claim 1, before forming the pseudo contact, further comprising: forming a silicon nitride layer conformally on the semiconductor substrate to cover the plurality of flash memory structures.

8. The manufacturing method of the semiconductor device according to claim 1, after forming the conductive material, further comprising:

planarizing the conductive material, until the interlayer dielectric layer is exposed to form at least one contact; and forming a metal wire on the interlayer dielectric layer to connect the at least one contact.

9. The manufacturing method of the semiconductor device according to claim 7, after removing the pseudo contact, further comprising: removing the silicon nitride layer in the contact opening.

10. A semiconductor device, comprising:

a semiconductor substrate having a plurality of active areas parallel to a first direction;

a plurality of flash memory structures parallel to a second direction which is orthogonal to the first direction, formed on the semiconductor substrate, wherein each of the flash memory structures comprises a floating gate formed on the semiconductor substrate and a control gate formed on the floating gate;

a plurality of contacts, formed between the plurality of flash memory structures and contacting the plurality of active areas of the semiconductor substrate;

an interlayer dielectric layer, formed on the semiconductor substrate except for the plurality of contacts and covering the flash memory structures;

a plurality of air gaps, formed in the interlayer dielectric layer and directly above the active areas, wherein each of the air gaps is between each of the contacts and each of the flash memory structures; and a liner film, disposed between the plurality of contacts and the interlayer dielectric layer and between each of the contacts and each of the air gaps.

11. The semiconductor device according to claim 10, further comprising a silicon nitride layer disposed below the interlayer dielectric layer to cover the plurality of flash memory structures.

12. The semiconductor device according to claim 10, wherein the liner film comprises a tetraethoxysilane (TEOS) oxide layer, a SixNy layer or a combination thereof.

13. The semiconductor device according to claim 10, wherein the contact is a bit-line contact.

14. The semiconductor device according to claim 10, wherein the semiconductor device is an NOR flash memory or an NAND flash memory.

15. The semiconductor device according to claim 11, wherein the liner film extends to be disposed between the silicon nitride layer and the interlayer dielectric layer.

\* \* \* \* \*